United States Patent
Williams et al.

(10) Patent No.: US 10,596,754 B2
(45) Date of Patent: Mar. 24, 2020

(54) REAL TIME INSPECTION AND CORRECTION TECHNIQUES FOR DIRECT WRITING SYSTEMS

(71) Applicant: The Boeing Company, Chicago, IL (US)

(72) Inventors: John Dalton Williams, Decatur, AL (US); Aaron Yi Mosher, Madison, AL (US); Preston Tyler Bushey, Huntsville, AL (US)

(73) Assignee: THE BOEING COMPANY, Chicago, IL (US)

( * ) Notice: Subject to any disclaimer, the term of this patent is extended or adjusted under 35 U.S.C. 154(b) by 557 days.

(21) Appl. No.: 15/364,204

(22) Filed: Nov. 29, 2016

(65) Prior Publication Data

US 2017/0348900 A1 Dec. 7, 2017

Related U.S. Application Data

(60) Provisional application No. 62/345,039, filed on Jun. 3, 2016.

(51) Int. Cl.
*B29C 64/106* (2017.01)
*G03F 7/20* (2006.01)
(Continued)

(52) U.S. Cl.
CPC .......... *B29C 64/106* (2017.08); *B29C 64/393* (2017.08); *B33Y 10/00* (2014.12);
(Continued)

(58) Field of Classification Search
CPC ............ B29C 67/0085; B29C 67/0096; B29C 67/0055; B29C 67/0051; B29C 67/0059;
(Continued)

(56) References Cited

U.S. PATENT DOCUMENTS 5,508,489 A * 4/1996 Benda ................... B22F 3/1055
219/121.76
6,162,378 A * 12/2000 Bedal ...................... B29C 41/52
264/40.1
(Continued)

FOREIGN PATENT DOCUMENTS

EP 1319733 6/2003
EP 2902174 8/2015

OTHER PUBLICATIONS

Da Baere et al., "Spectroscopic monitoring and melt pool temperature estimation during the laser metal deposition process", Journal of Laser Applications, Mar. 31, 2016, pp. 022303-1-022303-8, vol. 28, No. 2, Laser Institute of America, Orlando, Florida.
(Continued)

*Primary Examiner* — Robert C Dye
*Assistant Examiner* — Taryn Trace Willett
(74) *Attorney, Agent, or Firm* — Haynes and Boone, LLP

(57) ABSTRACT

A real time inspection and correction system and method for additive manufacturing process is described. The method may include operating a direct writing device configured to deposit material on a substrate through a tip to provide a portion of a product according to initial parameter values, receiving a hyperspectral image frame including a plurality of spectral images of the deposited material, processing the received hyperspectral image frame to determine a characteristic of the deposited material comparing the determined characteristic with a target characteristic determining at least one corrective parameter value to conform the determined characteristic to the target characteristic updating at least one of the initial parameter values with the corrective parameter values, and operating the direct writing device to deposit additional material on the substrate according to the corrective parameter value.

20 Claims, 10 Drawing Sheets

(51) Int. Cl.
  *B33Y 10/00* (2015.01)
  *B33Y 30/00* (2015.01)
  *B33Y 50/02* (2015.01)
  *B29C 64/393* (2017.01)
  *G06T 7/00* (2017.01)
  *H04N 5/33* (2006.01)

(52) U.S. Cl.
  CPC .............. *B33Y 30/00* (2014.12); *B33Y 50/02* (2014.12); *G03F 7/70416* (2013.01); *G06T 7/0004* (2013.01); *H04N 5/332* (2013.01)

(58) Field of Classification Search
  CPC ............ B29C 67/0062; B29C 67/0066; B29C 67/007; B29C 67/0074; B29C 67/0077; B29C 67/0081; B29C 67/0088; B29C 67/0092; B29C 64/20; B29C 64/245; B29C 64/25; B29C 64/295; B29C 64/00; B29C 64/188; B29C 64/264; B29C 64/268; B29C 64/277; B29C 64/291; B29C 64/386; B29C 64/39; B33Y 10/00; B33Y 30/00; B33Y 40/00; B33Y 99/00
  See application file for complete search history.

(56) References Cited

U.S. PATENT DOCUMENTS

| | | | | |
|---|---|---|---|---|
| 7,433,627 | B2* | 10/2008 | German | B41J 11/002 347/102 |
| 7,515,986 | B2* | 4/2009 | Huskamp | G05D 23/1919 219/405 |
| 7,537,722 | B2* | 5/2009 | Andersson | B22F 3/004 264/40.6 |
| 2004/0187714 | A1* | 9/2004 | Napadensky | B29C 33/448 101/35 |
| 2004/0200816 | A1* | 10/2004 | Chung | G05D 23/1919 219/121.83 |
| 2007/0196561 | A1* | 8/2007 | Philippi | B33Y 30/00 427/8 |
| 2007/0228592 | A1* | 10/2007 | Dunn | B29C 64/386 264/40.4 |
| 2008/0131546 | A1* | 6/2008 | Perret | B22F 3/1055 425/143 |
| 2009/0152771 | A1* | 6/2009 | Philippi | B33Y 10/00 264/410 |
| 2010/0125356 | A1* | 5/2010 | Shkolnik | G06T 1/00 700/98 |
| 2010/0323301 | A1* | 12/2010 | Tang | G03F 7/0037 430/325 |
| 2011/0268948 | A1* | 11/2011 | Ikuta | B29C 64/20 428/220 |
| 2011/0282482 | A1* | 11/2011 | Knighton | B33Y 30/00 700/111 |
| 2012/0100031 | A1* | 4/2012 | Ljungblad | B29C 64/153 419/7 |
| 2012/0280415 | A1* | 11/2012 | Halford | B29C 35/0288 264/40.1 |
| 2015/0045928 | A1* | 2/2015 | Perez | G05B 19/41875 700/110 |
| 2015/0061170 | A1* | 3/2015 | Engel | B33Y 10/00 264/40.1 |
| 2015/0061195 | A1* | 3/2015 | DeFelice | B29C 64/386 264/497 |
| 2015/0165681 | A1* | 6/2015 | Fish | B22F 3/1055 264/40.6 |
| 2015/0174658 | A1* | 6/2015 | Ljungblad | B33Y 10/00 419/55 |
| 2015/0328838 | A1* | 11/2015 | Erb | B33Y 50/02 700/119 |
| 2016/0096236 | A1* | 4/2016 | Cho | G01J 5/0806 219/76.12 |
| 2016/0096327 | A1* | 4/2016 | Fry | B33Y 30/00 264/443 |
| 2016/0250807 | A1* | 9/2016 | Atwood | B33Y 10/00 264/401 |
| 2016/0266573 | A1* | 9/2016 | Bheda | G05B 19/4099 |
| 2016/0339642 | A1* | 11/2016 | Donovan | B29C 64/165 |
| 2017/0151722 | A1* | 6/2017 | Prasad | B29C 67/00 |
| 2017/0304895 | A1* | 10/2017 | Porch | B33Y 10/00 |
| 2019/0022928 | A1* | 1/2019 | Bartow | C09D 11/101 |

OTHER PUBLICATIONS

Dang et al., "Influence of surfactant on the preparation of silver nanoparticles by polyol method," Adv. Nat. Sci.: Nanosci, Nanotechnol. 3, 2012, 035004, pp. 1-4.

Dang et al., "Silver nanoparticles ink synthesis for conductive patterns fabrication using inkjet printing technology," Adv. Nat. Sci.: Nanosci, Nanotechnol. 6, 2015, 015003, pp. 1-8.

Kraft, Erika Lorna, "Quantitative, Multi-Spectral, Light-Transmission Imaging of Colloid Transport in Porous Media at the Meso Scale", Dissertation, Apr. 21, 2011, 230 pages, Oregon State University, Oregon.

Chumachenko et al., "In situ formation of silver nanoparticles in linear and branched polyelectrolyte matrices using various reducing agents," Nanoscale Research Letters, 2014, pp. 1-7, vol. 9:164, Springer, Berlin, Germany.

Bober et al., "In-situ prepared polyaniline-silver composites: Single- and two-step strategies", Electrochimica Acta, 2014, pp. 259-266, vol. 122, Elsevier, Amsterdam, Netherlands.

Omastova et al., "Towards conducting inks: Polypyrrole-silver colloids," Electrochimica Acta, 2014, pp. 296-302, vol. 122, Elsevier, Amsterdam, Netherlands.

Lenhart et al., "Inkjet printable polyaniline-gold dispersions," Thin Solid Films, 2011, pp. 4351-4356, vol. 519, IEEE, Piscataway, New Jersey.

Chen et al., "Using nanoparticles as direct-injection printing ink to fabricate conductive silver features on a transparent flexible PET substrate at room temperature," Acta Materialia, 2012, pp. 5914-5924, vol. 60, Elsevier, Amsterdam, Netherlands.

Walker et al., Reactive Silver Inks for Patterning High-Conductivity Features at Mild Temperatures, Journal of the American Chemical Society, 2012, vol. 134, pp. 1419-1421, American Chemical Society, Washington, DC.

Quinsaat et al., "Continuous Production of Tailored Silver Nanoparticles by Polyol Synthesis and Reaction Yield Measured by X-ray Absorption Spectroscopy: Toward a Growth Mechanism," The Journal of Physical Chemistry, 2014, pp. 11093-11103, vol. 118, American Chemical Society, Washington, DC.

Saviello et al., "Synchrotron-based FTIR microspectroscopy for the mapping of photo-oxidation and additives in acrylonitrile-butadiene-styrene model samples and historical objects", Analytica Chimica Acta, 2014, pp. 59-72, vol. 843, Elsevier, Amsterdam, Netherlands.

Joo et al., "Interfacial Adhesion of Nano-Particle Silver Interconnects for Electronics Packaging Application", Electronics Components and Technology Conference, 2008, pp. 1417-1423, IEEE, Piscataway, New Jersey.

Hicks et al., "Electrochemical impedance characterization of tungsten trioxide-polyaniline nanocomposites for room temperature acetone sensing," Sensors and Actuators B: Chemical, 2014, pp. 283-289, vol. 194, Elsevier, Amsterdam, Netherlands.

Sega et al., "Thermally Modulated Porous Silica Multispectral Filters and Their Application in Remote Imaging," ACS NANO, 2013, pp. 7785-7794, vol. 7, No. 9., American Chemical Society, Washington, DC.

Zakian et al., "Near-infrared hyperspectral imaging of teeth for dental caries detection", Journal of Biomedical Optics, 2009, pp. 064047-1-064047-7, vol. 14, No. 6, SPIE, Bellingham, WA.

* cited by examiner

REAL TIME INSPECTION AND CORRECTION TECHNIQUES FOR DIRECT WRITING SYSTEMS

CROSS REFERENCE TO RELATED APPLICATIONS

This application claims the benefit of U.S. Provisional Patent Application No. 62/345,039 filed Jun. 3, 2016, which is hereby incorporated by reference in its entirety.

BACKGROUND

Technical Field

The present application generally relates to direct writing systems. More in particular, it relates to real time inspection and correction system and method for direct write material.

Related Art

One type of direct writing is additive manufacturing, which is also referred to as three-dimensional (3D) printing, and it promises to be an enabling technology for low cost manufacturing of complex components. However, 3D printed parts are often plagued by particle contamination, uniformity of deposition, porosity, void defects, thermal gradients, and variable solvent content during deposition.

Various steps are taken to mitigate unwanted process variables, including the use of HEPA filters, temperature and humidity control, pre-packaged raw materials, and deposition ovens. Unfortunately, the wide variety of additive approaches coupled with the large number of individual process variables makes it very difficult to realize highly repeatable microstructures using open loop control techniques.

The emerging market for liquid dispense printing is not as simple as conventional plastic 3D printing. Liquid dispense can be used on a wide variety of materials including electronic inks, glass, ceramic powders, polymer composites, photoresists, and biological media. This broad material compatibility makes the problem much harder. Simply put, the wide variety of test data required for such a toolset makes it difficult to apply many of standard mechanical and electrical probes for inspection. Thus, other methods for measuring chemical and spatial data on the deposited material in real time to quantify manufacturing rules are needed.

Conventional metrology processes for additive manufacturing and many other environments where these techniques can be used are processes that are performed post manufacturing. Thus, a part or a component is formed and/or dried and then removed from the manufacturing device to perform chemical spectroscopy. Therefore, it is difficult to measure the deposition and drying conditions in time to understand the distinct effects and process improvements provided by chemical additives in complex chemical solutions.

SUMMARY

Systems and methods are disclosed herein in accordance with various embodiments that provide for inspecting a product that is being manufactured through a direct writing process, and for adjusting manufacturing parameters in real time in response to the inspection in order to improve the quality or characteristics of the product. In some embodiments, hyperspectral imaging is use to capture spectral images, which are then processed and analyzed to determine the parameters that should be adjusted.

According to an embodiment, a method for a real time inspection and correction during an additive manufacturing process is described. The method may include operating a direct writing device configured to deposit material on a substrate through a tip to provide a portion of a product according to initial parameter values, receiving a hyperspectral image frame including a plurality of at least one of spectral and spatially resolved images of the deposited material, processing the received hyperspectral image frame to determine a characteristic of the deposited material comparing the determined characteristic with a target characteristic determining at least one corrective parameter value to conform the determined characteristic to the target characteristic updating at least one of the initial parameter values with the corrective parameter values, and operating the direct writing device to deposit additional material on the substrate according to the corrective parameter value.

According to another embodiment, a system may include a memory including instructions, and a processor configured to execute the instructions to perform operations including operating a direct writing device configured to deposit material on a substrate through a tip to provide a portion of a product according to initial parameter values, receiving a hyperspectral image frame comprising a plurality of at least one of spectral and spatially resolved images of the deposited material, processing the received hyperspectral image frame to determine a characteristic of the deposited material, comparing the determined characteristic with a target characteristic, determining at least one corrective parameter value to conform the determined characteristic to the target characteristic, updating at least one of the initial parameter value with the corrective parameter values, and operating the direct writing device to deposit additional material on the substrate according to the corrective parameter value.

The system and method may include performing edge detection and line segment detection on one or more of the spectral images to measure at least one of width and height of the deposited material, and comparing the measured at least one of width and height with predetermined at least one of width and height stored in a dimensional database.

The corrective parameter value of the system and method may correspond to at least one of a height of the tip, a flow rate of source material through the tip, and a translation speed of the tip, to adjust at least one of a width and a height of the additional deposited material.

The system and method may include performing an arithmetic operation with two or more of the spectral images to generate at least a porosity profile and surface roughness profile (902) of the deposited material, and comparing the generated at least one of porosity profile and surface roughness profile with at least one of a porosity profile and surface roughness profile stored in at least one of a porosity database and surface roughness database.

The arithmetic operation may include overlaying a plurality of spectral images associated with different spectral bands and subtracting differences between the two or more spectral images captured at the different spectral bands.

The corrective parameter value of the system and method may correspond to at least one of a flow rate of the additional material through the tip and a temperature of the substrate, to adjust a surface roughness of the additional deposited material.

The system and method may include generating an absorbance profile of the deposited material based on one or more of the spectral images, comparing the generated absorbance profile with an absorbance profile stored in an absorbance profile database, and performing a chemical analysis of the deposited material based on the absorbance profile to identify a chemical composition of the deposited material.

They system and method may further include generating an absorbance profile of the deposited material based on one or more of the spectral images, comparing the generated absorbance profile with an absorbance profile stored in an absorbance profile database, and performing a chemical analysis of the deposited material based on the absorbance profile to identify a chemical composition of the deposited material.

The system and method may further include receiving at least an additional hyperspectral image frame captured at a different time from the hyperspectral image frame, the additional hyperspectral image including a plurality of additional spectral images of the deposited material at the different time, wherein the processing includes generating a plurality of absorbance profiles of the deposited material at different times based on the spectral images and the additional spectral images, the comparing includes comparing each of the absorbance profiles with reference absorbance profiles stored in an absorbance database to determine solvent content in the deposited material, and the corrective parameter value corresponds to at least one of a temperature of a substrate and a flow rate of the additional material through the tip, to adjust a drying time of the deposited material.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1:
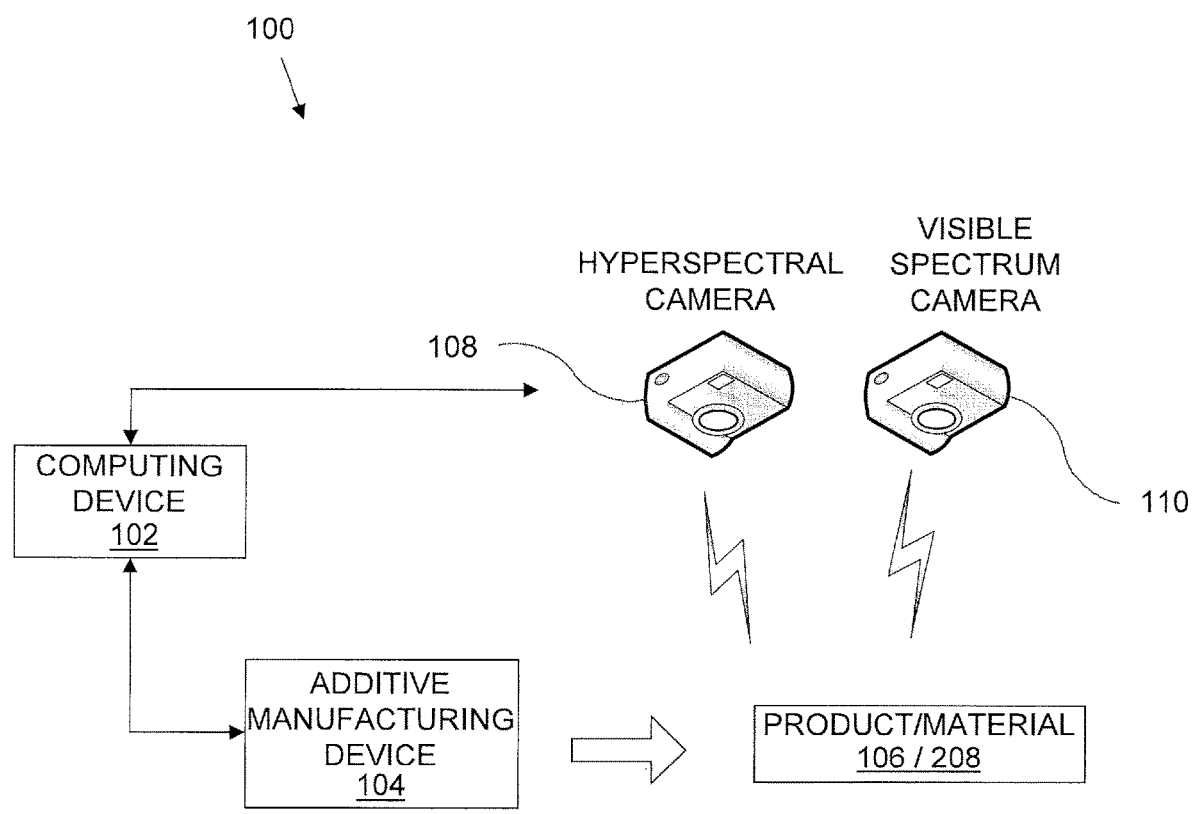
FIG. 1 is an overview block diagram of an additive manufacturing system according to an embodiment of the present disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

Various embodiments of the present disclosure provide systems and methods for improving characteristics or quality of direct write materials (e.g., material used for fused deposition modeling (FDM) in additive manufacturing, material used for liquid dispense printing such as conductive ink (e.g., silver ink) or paint, and/or other material used in various direct write systems and methods). While the described techniques may be applicable for systems that use a variety of different direct write materials, herein the present disclosure, the various direct write material will be referred to generally as deposition material (or source material).

In additive manufacturing, deposition material is deposited from the additive manufacturing device on to a substrate or deposition surface. In FDM, the deposition material may be deposited three dimensionally to construct a 3D product or an object. Herein the present disclosure, "additive manufacturing" is not intended to be limiting, but instead, it is intended to refer to any type of direct write manufacturing process which may include both FDM manufacturing and/or liquid dispense manufacturing processes. In liquid dispense printing, a liquid material such as conductive ink may be deposited on the deposition surface two dimensionally to produce, for example, an electronic circuit.

When the deposition material is deposited on the deposition surface, a number of engineering process variables or parameters are configured in order to build the project in a desired manner. For example, in the case of a plastic deposition material for FDM, the temperature of the dispense head melting the plastic before it is deposited may affect the ability of the plastic material fusing together. Furthermore, the temperature may also affect the viscosity of the plastic material, which together with the translation speed of the deposition head may affect the quality of the product being manufactured. These parameters, along with other parameters are initially set to an initial set of parameter values at the start of the manufacturing printing process.

For example, the initial set of parameter values may be a set of values that are determined by performing mathematical computations that theoretically produce the best results, or it may be a set of values that were used for a previous production cycle that produced the best results. However, no two cycles are exactly alike and therefore, while the initial set of values may produce somewhat acceptable results, improvements to the cycle may be made by adjusting the parameters to fine tune the characteristics and quality of the deposition material before the manufacturing process is finished and formed into a completed product. However, in order to fine tune the parameters, the current state of the deposition material and the product is necessary. That is, it is necessary to understand the current characteristic and quality of the deposited material so that a determination can be made as to what engineering rules or parameters should be adjusted in order to improve the deposition characteristics and quality. Here, characteristics and quality refers to particle contamination, uniformity of the deposited material, porosity, void defects, thermal gradients, and variable solvent content during the deposition.

The techniques described in the present disclosure provide methods for inspecting the deposition material through the use of a non-invasive monitoring system that provides real time feedback of the material deposition process to analyze for chemical spectra, porosity, surface roughness, void content, fill factor, and physical geometry. More specifically, the described embodiments use hyperspectral cameras to obtain hyperspectral imaging to measure in-situ deposition of the deposited materials (e.g., deposition material that has been deposited or dispensed by the deposition tip on to a surface or substrate). Hyperspectral cameras simultaneously collect scene data (spectral images) in many (e.g., hundreds of) narrow wavelength bands over a broad spectral range in a single image frame. The images captured by the camera are then combined to provide both a spectroscopic map of the image scene and detailed surface data. The combined analysis capability provided by the hyperspectral cameras provide a distinctive advantage over other nondestructive test and evaluation methods such as electrical contact probes and quartz crystal microbalances where only mass and electrical conductivity would be recorded. Likewise, the multispectral image provides significantly more data than data that can be obtained from a narrow band or a single wavelength reflectometer.

Furthermore, the described techniques use both spectroscopic and surface mapping data obtainable from the hyperspectral images to qualify a set of engineering manufacturing rules or parameters required to regulate a closed loop control system for additive manufacturing and flexible hybrid electronics. The described techniques may also be used in screen printing, large area paint processes, and liquid dip coat processes that also occur in conventional manufacturing environments. In some embodiments, the system may create an open loop control system that requires and operator to "close the loop" by approving the controls. In other embodiments, the system is a fully closed loop that does not require operator intervention to close the loop and apply the controls.

FIG. 1 is an overview block diagram of an additive manufacturing system 100 according to an embodiment. The system 100 includes an additive manufacturing device 104, a hyperspectral camera 108, a visible spectrum camera 110, a computing device 102, and a deposition surface. The visible spectrum camera 110 may be a conventional digital camera that may typically be included with the additive manufacturing device 104. The visible spectrum camera 110 may be mounted near the deposition tip of the of the additive manufacturing device 104 so that it can capture images or provide a video feed of the deposition material to an operator. The computing device 102 may be electronically coupled to the additive manufacturing device 104 and the visible spectrum camera 110, and may include a user interface. The hyperspectral camera 108 may also be mounted to the additive manufacturing device 104 near the deposition tip of the additive manufacturing device 104, and the computing device 102 may also be electronically connected to the hyperspectral camera 108 and the additive manufacturing device 104. Thus, an operator may use the computing device 102 to provide instructions to the additive manufacturing device 104 to perform desired functions, e.g., start deposition, and at the same time, the operator may also instruct the hyperspectral camera 108 and/or the visible spectrum camera 110 to start capturing images. Accordingly, the additive manufacturing device 104 may be controlled by the computing device 102 to undergo a manufacturing process by depositing the deposition material through the deposition tip and onto the deposition surface to produce a product 106 from the deposited material 208. Herein the present disclosure, product 106 refers to a completed object that is manufactured using the deposition material. Deposited material 208 refers to an incomplete portion of the product 106 that is still in the process of being manufactured.

The hyperspectral camera 108 may be any conventional hyperspectral camera as long as the camera meets the physical size, spectral bandwidth, and resolution needs for the task. Various factors may be considered when selecting a hyperspectral camera. For example, the commercially available Bayspec OCI-UAV-D2000 camera is physically compact in size but the spectral resolution may be limiting for performing spectroscopic analysis of conductive silver inks at 400 nm. The Specim V10H camera operates over the desired bandwidth, provides improved spectral resolution and provides a similar frame rate (>75 frames/sec). The Headwall VNIR Micro Hypersec A camera provides a similar performance specification to the Specim V10H, but images all of the data simultaneously over the 400-1000 nm range. The Headwall camera is larger and may require a one foot focal length to image the liquid dispensed material. The xiSpec MQ022HG-S camera, which is by far the smallest and easiest to integrate onto a variety of platforms, has a limited spectral bandwidth, which may reduce the number of different materials that can be characterized. Thus, a number of different hyperspectral cameras may be utilized by considering the specification of the camera. Table 1 below shows a comparison of the camera specifications.

TABLE 1

| Hyperspectral Camera Characteristics | Headwall VNIR Micro-Hypersec A | Bayspec OCI UAV-D2000 | Specim V10H | xiSpec MQ022HG-S |
| --- | --- | --- | --- | --- |
| Operational Mode | Snapshot | Snapshot | Prog. Scan | Snapshot |
| Spectral Bandwidth | ~400-1000 nm | ~450-970 nm | 400-1000 nm | 470-630 nm |
| Spectral Resolution | 1.9 nm | 12-15 nm | 7 nm | 10-15 nm |
| Spatial Pixels |  | 500 × 270 | 760 × 582 |  |

TABLE 1-continued

| Hyperspectral Camera Characteristics | Headwall VNIR Micro-Hypersec A | Bayspec OCI UAV-D2000 | Specim V10H | xiSpec MQ022HG-S |
|---|---|---|---|---|
| Exposure Time | 0.12 ms | 0.1-300 ms | 0.13 ms | 5 ms |
| Lens Interface | F-mount | F-mount | C-mount | C-mount |
| Camera Data/Image | High (2 GB/min) | Low (0.25 GB/min) | Med (0.5 GB/min) | Med |
| Camera Size | 9 × 3 × 8 in$^3$ | 2 × 2 × 3 in$^3$ | 2 × 2 × 5 in$^3$ | 1 in$^3$ |

Figure 2:
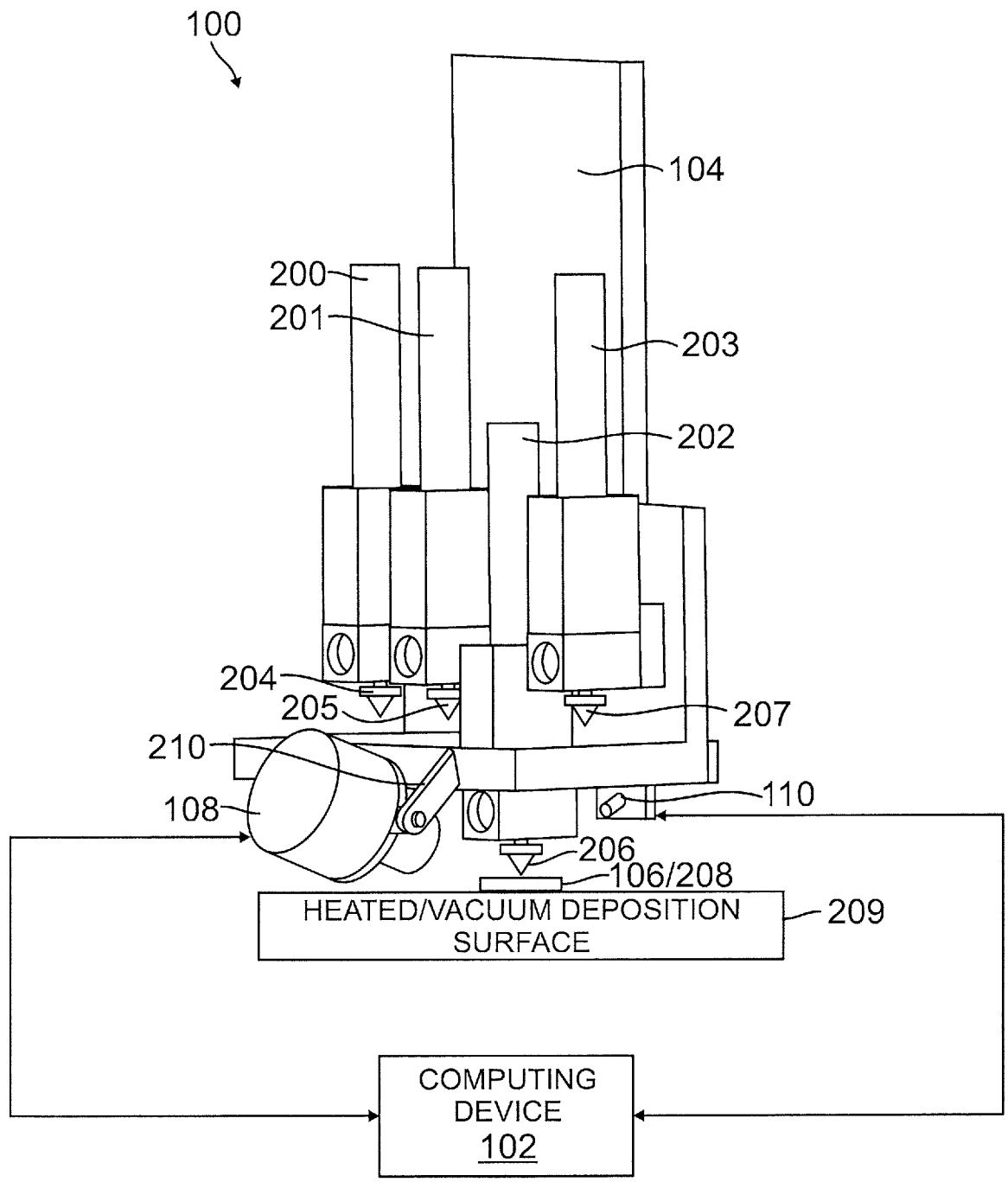
FIG. 2 is an external view of an exemplary additive manufacturing device, according to an embodiment of the present disclosure.

FIG. 2 is an external view of an example additive manufacturing system 100, according to an embodiment. By way of example and not of limitation, the additive manufacturing system 100 includes an additive manufacturing device 104 illustrated in FIG. 2 is an nScrypt 3Dn-300 dispense/FDM deposition device.

In more detail, the additive manufacturing device 104 includes four dispense heads, a first dispense head 200, a second dispense head 201, a third dispense head 202, and a fourth dispense head 203, and each dispense head has a corresponding deposition tip, a first deposition tip 204, a second deposition tip 205, a third deposition tip 206, and a fourth deposition tip 207. Each dispense head may hold or contain different deposition material. For example, the first dispense head 200 may hold a nylon, the second dispense head 201 may hold acrylonitrile butadiene styrene (ABS), the third dispense head 202 may hold a conductive ink, and the fourth dispense head 203 may hold a liquid polymer composite, by way of example. Depending on the application, some or all of the dispense heads may be used. Moreover, the dispense heads are swappable, and therefore an operator may remove one dispense head and replace with another dispense head. In one embodiment, the dispense head is an interchangeable pick-and-place head for electronics placement. For example, one may be a room temperature liquid dispense head, and one may be a heated liquid dispense head for processes where solvent content of the dispensed liquid plays a critical factor in the success of the printed part. Each dispense head may be lower when in operation and raised when not in use.

The additive manufacturing device 104 may also include a deposition surface 209 for depositing the deposition material. The deposition surface 209 may be a part of the additive manufacturing device 104 or it may be a separate component from the additive manufacturing device 104. In some embodiments, the deposition surface 209 may have a heated surface for heating the deposition material 208 as it is deposited on the deposition surface 209. By heating the deposited material 208 from the deposition surface 209, the operator may be able to further control the drying time of the deposited material 208. Yet in some embodiments, the deposition surface 209 may have a vacuum surface. The vacuum surface may be used to apply a vacuum suction to a product that is placed on the deposition surface 209 to hold it in place. Yet in other embodiments, a substrate may be placed on the deposition surface and the deposition material may be deposited on the substrate so that it is not placed directly on the deposition surface. Table 2 below provides a set of parameters and process capability of an example additive manufacturing device 104.

TABLE 2

| Example Device | Process Capability |
|---|---|
| Allowable Print Volume | 12 × 12 × 6 in$^3$ |
| Active Print Heads (x4) | 4 per process |
| 425° C. Temp FDM Head (x1) | PEEK, Ultem, PEKK |
| 275° C. FDM Head (x2) | PLA, ABS, HIPS, nylon, PC |
| Liquid Dispense Head (x1) | Electronic Inks: conductive, resistive, insulative Polymer Composites: ceramic, ferrite, magnetic Spin on Glass |
| Heated Liquid Dispense Head (x1) | Improved solvent control during liquid dispense |
| Pick and Place Head (x1) | Integration of prepackaged electronics |
| Vacuum or Heated Print Plate | 12 × 12 in$^2$ |
| Advanced Optical Alignment | Automatic alignment on previous patterns |
| Ceramic Print Tips | 12.5, 25, 50, 75, 100, 125, & 150 μm |

According to an embodiment, the use of multiple FDM dispense heads provides the ability to create a complex 3D printed assembly using ULTEM, laser direct structuring (LDS) Platable ABS, and high impact polystyrene (HIPS), while stopping at different layer segments to add conductive ink or polymer composites for additional electronic functionality. In contrast, a single FDM dispense head may be used to create a simple single material 3D product. Additionally, some additive manufacturing devices may use a generic design for the ceramic deposition tip that allows the user to specify several different tip diameters and implement them independently on each dispense head. In some embodiments, groupings of deposition tips may behave similarly based on the size of the orifice. However, the process parameters required to deposit conductive inks with a 25 micrometer deposition tip may vary significantly when compared to the write conditions needed to print with a 125 micrometer deposition tip. The described techniques of the present disclosure may quantify differences in solvent content and porosity when printing with two different tip sizes through the use of hyperspectral imaging.

According to an embodiment, hyperspectral camera 108 may be mounted to the additive manufacturing device 104 with a mounting bracket 210 near the base of the device and angled such that the hyperspectral camera 108 is directed toward the deposition tip of the dispense head. In the illustrated embodiment, the third dispense head 202 is selected so the hyperspectral camera 108 is directed to the third deposition tip 206. In some embodiments, the mounting bracket 210 may be a motorized bracket so that the direction of the hyperspectral camera 108 may be moved by an operator from a remote location, e.g., a user interface of a computing device. Thus, if the second dispense head 201 is selected, then the motorized mounting bracket 210 may automatically adjust the direction of the hyperspectral camera 108 in the direction of the second deposition tip 205. In some embodiments, a visible spectrum camera 110 may also be mounted to the additive manufacturing device 104. The visible spectrum camera 110 may be a low resolution camera that is merely used by the operator to remotely provide an active video feed of the deposition process or it may be a higher resolution camera that may be used for measuring dimensions of the deposited material.

Figure 3:
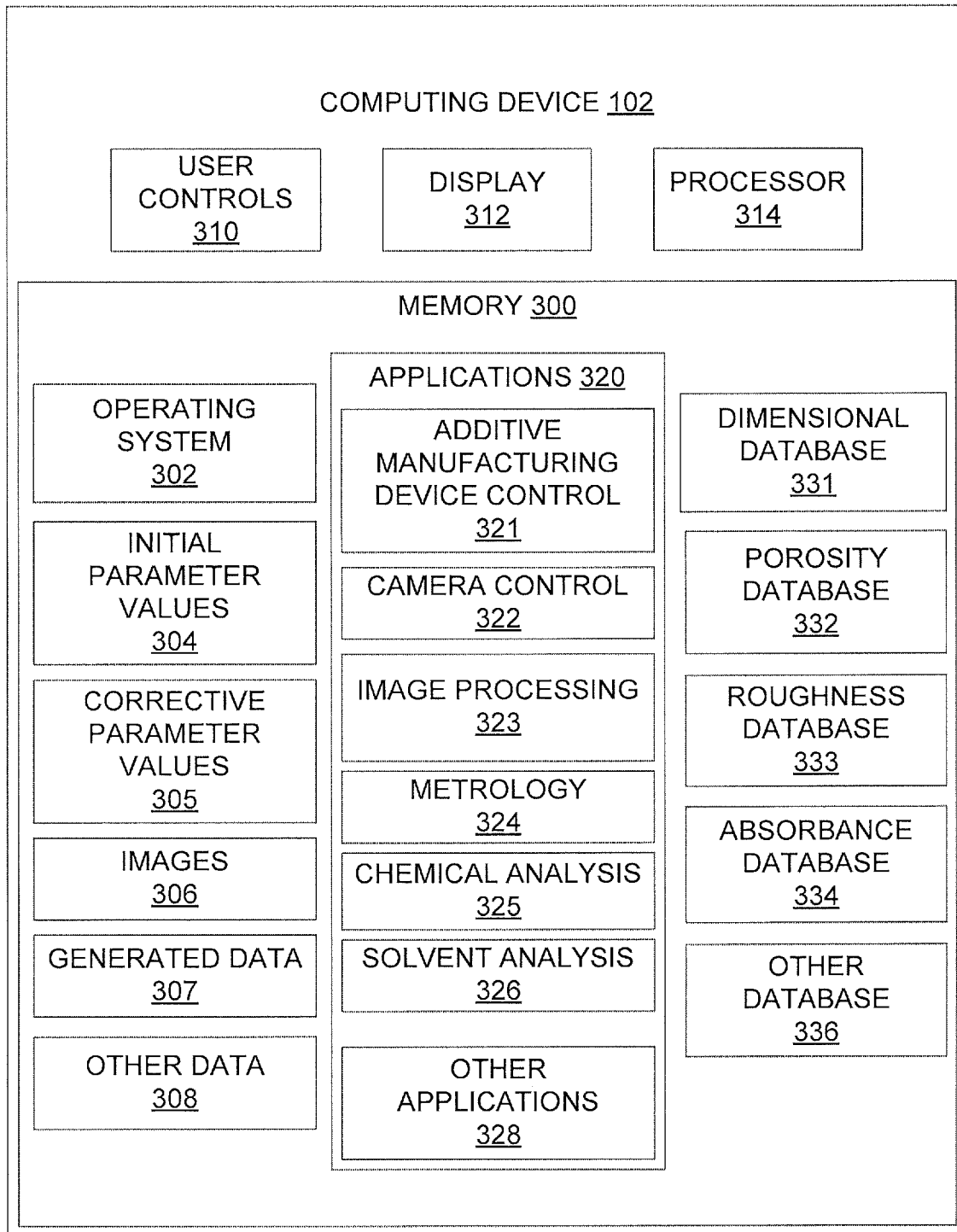
FIG. 3 is a block diagram of a computing device used with the additive manufacturing device, according to an embodiment of the present disclosure.

As discussed, the various techniques provided herein may be implemented by a computing device 102 which may include, in some embodiments, one or more subsystems and related modules thereof. FIG. 3 is a block diagram of the computing device 102 used with the additive manufacturing device 104 illustrated in FIG. 1, according to an embodiment. Although a variety of components are illustrated in FIG. 3, components may be added and/or omitted for different types of devices as appropriate in various embodiments. According to an embodiment, the computing device 102 includes user controls 310, a display 312, a processor 314 and a memory 300.

The display 312 may be, for example, a flat screen display or a touch screen display. In some embodiments, the user controls 310 may be integrated with and may also be a part of the display 312. For example, a touch screen display may have a user interface 900 (FIG. 9) including user controls 310 where the operator may adjust various settings and/or parameters by touching the user interface with fingers to control the additive manufacturing device 104. In other embodiments, the user controls 310 may be a separate component from the display 312. For example, the computing device 102 may have separate user controls 310 that may have a plurality of buttons, switches, and dials to adjust the various settings and/or parameters by pushing the buttons, flipping the switches, and/or turning the dials.

The processor 314 may be implemented as one or more microprocessors, microcontrollers, application specific integrated circuits (ASICs), programmable logic devices (PLDs) (e.g., field programmable gate arrays (FPGAs), complex programmable logic devices (CPLDs), field programmable systems on a chip (FPSCs), or other types of programmable devices), codecs, and/or other processing devices.

In some embodiments, the processor 314 may execute machine readable instructions (e.g., software, firmware, or other instructions) stored in the memory 300. In this regard, the processor 314 may perform any of the various operations, processes, and techniques described herein. For example, in some embodiments, the various processes and subsystems described herein (e.g., additive manufacturing device control 321, image processing 323) may be effectively implemented by the processor 314 executing appropriate instructions. In other embodiments, the processor 314 may be replaced and/or supplemented with dedicated hardware components to perform any desired combination of the various techniques described herein.

The memory 300 may be implemented as a machine readable medium storing various machine readable instructions and data. For example, in some embodiments, memory 300 may store an operating system 302 and applications 320 as machine readable instructions that may be read and executed by the processor 314 to perform the various techniques described herein. The memory 300 may also store data used by operating system 302 and/or applications 320. In some embodiments, memory 300 may be implemented as non-volatile memory (e.g., flash memory, hard drive, solid state drive, or other non-transitory machine readable mediums), volatile memory, or combinations thereof.

The applications 320 may include applications such as, additive manufacturing device control 321, camera control 322, image processing 323, metrology 324, chemical analysis 324, and solvent analysis 326, as well as other applications 328 that are not necessarily provided herein. The additive manufacturing device control 321 may be configured to provide commands to the additive manufacturing device 104 in response to receiving commands from a user at the user controls 310 or it may be in response to an automated command generated by the additive manufacturing device control 321 application. In some embodiments, initial parameter values 304 are stored in memory 300 and the additive manufacturing control 321 may set the parameter values of the additive manufacturing device 104 to the initial parameter values 304. The additive manufacturing device control 321 may process hyperspectral images captured by the hyperspectral camera 108 to generate corrective parameter values 305 to update the parameter values of the additive manufacturing device 104.

The images 306 captured by the hyperspectral camera 108 and the visible spectrum camera 110 may also be stored in the memory 300. Camera control 322 application of the hyperspectral camera 108 or the visible spectrum camera 110 may be used to provide various commands to the hyperspectral camera 108 or the visible spectrum camera 110, such as, for example, start/stop capturing images and moving the angle of the cameras. When the camera captures the images, the camera control 322 application may be configured to retrieve the images from the camera and store them in images 306 of the memory 200. The image processing 323 application may be used to further process the images captured by the hyperspectral camera 108. The images may be retrieved from images 306 and processed to perform one more functions such as metrology 324, chemical analysis 325, solvent analysis 326 to generate data such as dimensions of the deposited material or the dispense tip, chemical or material identification of the deposition material, or solvent concentration, and store the generated data 307 in the memory 300. Other data 308 not necessary for the understanding of the embodiment of the present disclosure may also be stored and/or retrieved in the memory 300.

In some embodiments, when performing metrology 324, information related to dimensions of the deposited material or the deposition tip may be stored and/or retrieved from dimensional database 331 in the memory 300. Chemical analysis 325 may be performed by comparing absorbance profiles of the deposited material as processed by the image processing 323 application. The absorbance profile may then be compared with set absorbance profiles stored in absorbance database 334 in the memory 300. Based on this comparison, the chemical material can be identified. The image processing 323 application may also be used to determine porosity and surface roughness of the deposited material. The porosity and surface roughness may also be stored and/or retrieved from the porosity database 332 or the surface roughness database 333. Yet in some embodiments, other database 336 may be utilized to perform further functions that are not necessarily provided for in the present disclosure. In this manner, system 100 may implement a computing device 102 for providing a real-time corrective feedback to the additive manufacturing device 104.

Figure 4:
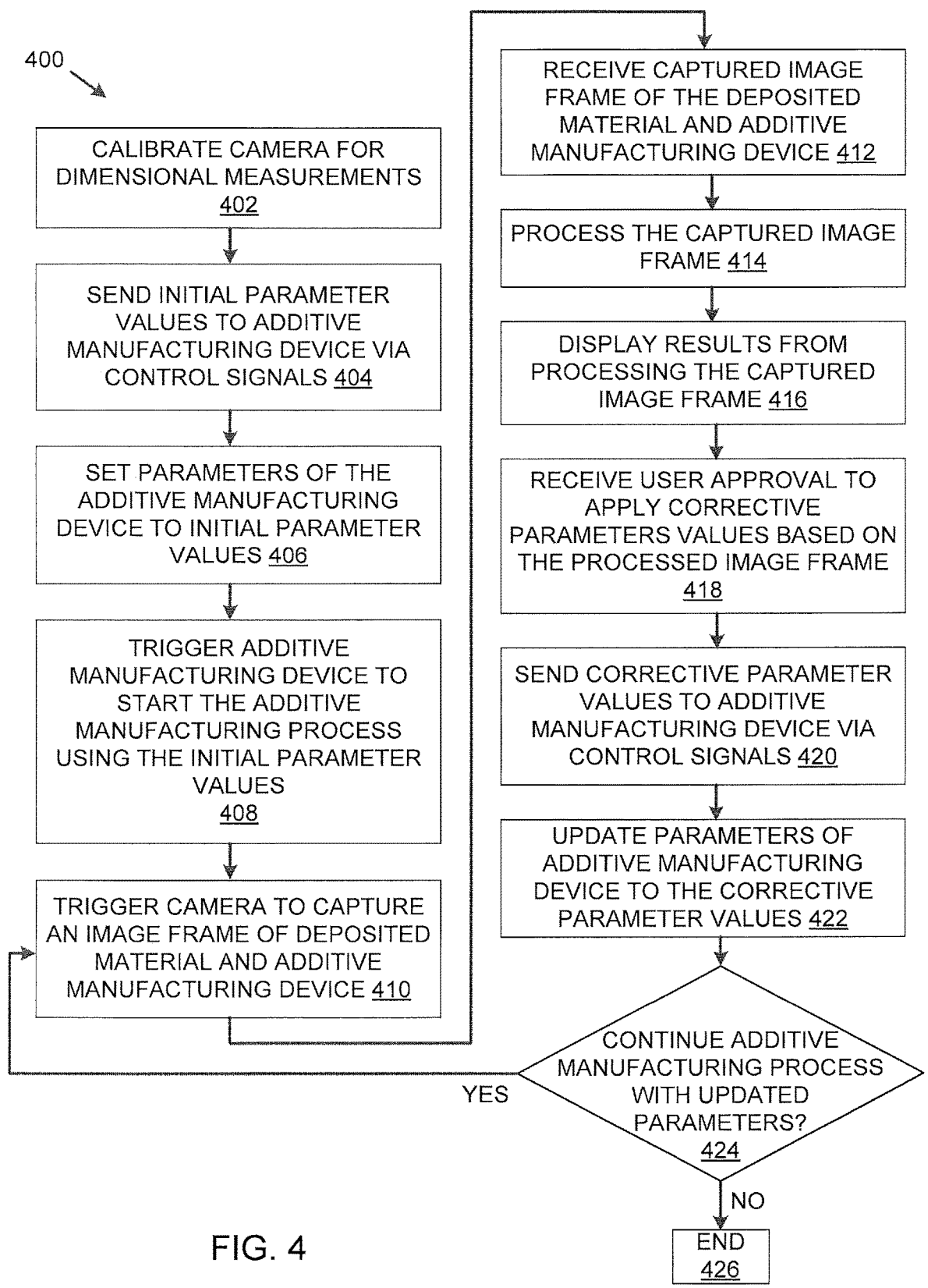
FIG. 4 is a flow chart illustrating an additive manufacturing process and a method for adjusting the manufacturing process based on real time inspection of deposited material, according to an embodiment of the present disclosure.

FIG. 4 is a flow chart 400 illustrating an additive manufacturing process and an exemplary method for adjusting the manufacturing process based on real time inspection of deposited material. According to an embodiment, the system 100 may perform a dimensional analysis of deposited material and deposition tip based on images captured with a camera. In order to accurately measure the dimensions, the camera is calibrated at block 402. The camera may be calibrated by using the geometry of the deposition tip of the dispense head to define reference information in order to calibrate the camera to perform dimensional measurements. In some embodiments, the deposition tip is made from a ceramic nozzle tip that is machined from a cylindrical rod of uniform radius and tip angle. The very tip of the nozzle is polished back to produce a 25-175 micron flat, and the inside of the ceramic rod is bored out with a laser to produce the tip opening. In order to calibrate, the pixels are compared against the predetermined angle of the nozzle and the size of the base of the deposition tip. In some embodiments, machined tubes of constant diameter may be used as the deposition tip instead of the ceramic rod. In such case, a similar calibration technique may also be applied. The accuracy of the image captured dimensions may be verified by measuring the sample using a white light or laser interferometer and the image processed profile measurements is compared with that of a 3D imaged surface.

Once the camera is calibrated, initial parameters values for the additive manufacturing process are sent to the additive manufacturing device 104 through control signals provided by the computing device 102 at block 404. At this point, various machine and/or desired material parameters of the additive manufacturing device 104 are set to initial parameter values 406. Examples of parameters include but are not limited to, flow rate of the deposition material, temperature of the dispense head, temperature of the deposition surface (or substrate), dispense tip height from the substrate, translation speed of the dispense tip, air pressure, solvent content, chemical release rate, plasmonic resonance, optical refractive index, mechanical stress, and surface tension. In some embodiments, the initial parameter values may be set based on the last used parameter value or the best parameter value previously determined for a similar application. In other embodiments, the initial parameter values may be computed by the operator using estimated values.

Once the additive manufacturing device 104 is calibrated and the initial parameter values are set, the additive manufacturing device 104 is triggered by the computing device to start the additive manufacturing process using the initial parameter values at block 408. Thus, as the manufacturing starts, the deposition material is released from the dispense head at a flow rate and a temperature set by the initial parameter values. In manufacturing, every process and scenario is unique, and while some scenarios may be similar (e.g., producing the same product using the same material), each process may have slight differences due to various factors affecting the material or the environment. For example, the deposition material may have irregularities, the environmental/atmospheric conditions of the room may change, random deposition of previously used material on the deposition tip, microscopic debris on the deposition surface, deposition material and/or deposition tip, random or material dependent discrepancies in the substrate causing changes in surface bonding energies, and/or microscopic variations in substance uniformity.

Thus, while parameter values that may have been the perfect value for a previous scenario, it may need adjustments to produce the ideal product. In order to fine tune the parameter values, a camera such as a hyperspectral camera 108 or a visible spectrum camera 110 is triggered by the computing device 102 to capture an image frame of the deposition material in real time while the deposition material is being deposited, at block 410. Next, the image frame is received by the computing device 102 at block 412 and processed at block 414, in order to determine the characteristics and/or quality of the deposition material that was just deposited. That is, the camera is configured to capture an image frame of the deposition material before the product is completely created in order to make continuous improvements to the characteristic of the deposition material as the remainder of the product is deposited.

According to an embodiment, the captured images are processed by the computing device at block 414 to determine the parameter values that should be adjusted in order to improve the characteristics of further deposited material. Various types of processing are performed on the images to inspect for different problems with the deposition material. They may vary depending on the type of deposition material being used and the type of defect that is determined. More specific processing techniques will be described later with reference to FIGS. 5-8.

Once the computing device determines the parameter values should be adjusted and the amount in which such values should be adjusted, this information may be displayed at the computing device so that an operator of the additive manufacturing device 104 may view (e.g., display) this information and decide to accept the recommended corrective adjustments to the parameter values, decline them, or modify the recommended corrective adjustments, at block 416. Once the user provides the user's input (e.g., approval) to apply the corrective adjustments to the parameter values at the user controls 310, the computing device 102 receives the user's inputs (e.g., approval) at block 418, and the computing device 102 sends the corrective parameter values to the additive manufacturing device 104 using control signals from the computing device 102 at block 420 to the additive manufacturing device 104 to update the parameter values of the additive manufacturing device 104 at block 422. In some embodiments, the corrective parameter values determined by the computing device 102 is automatically applied to the additive manufacturing device 104 through control signals without the operator approving the corrective adjustments. Thus, the manufacturing steps may be performed autonomously in a closed loop feedback without user intervention. Accordingly, the quality and the characteristics of an ongoing deposition material during a deposition process may be inspected in real time, and corrective actions may be implemented in in real time. Furthermore, the described inspection and corrective technique may be continued with updated parameters continually applied during the entire additive manufacturing process in order to produce a product having the least amount of defects at block 424 by repeating blocks 410 to 422. When it is desired to stop the inspection and correction techniques provided herein, the process may be ended at block 426.

Figure 5:
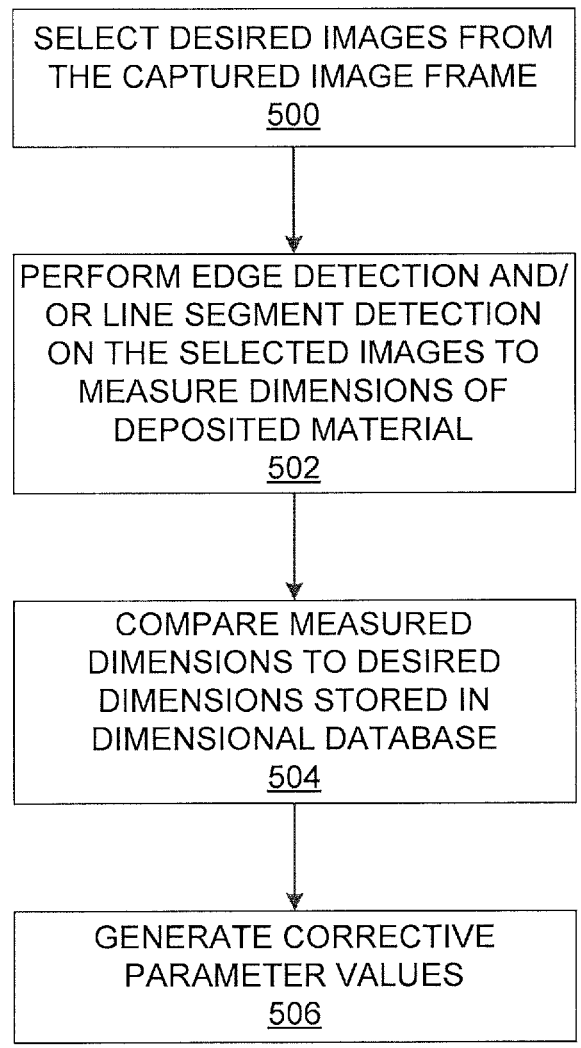
FIG. 5 is a flow chart illustrating a process for measuring and correcting dimension of the deposited material, according to an embodiment of the present disclosure.

FIG. 5 is a flow chart illustrating an exemplary process for processing the captured image frame discussed in block 414 of FIG. 4 for measuring and correcting dimensions of the deposited material. As discussed above with reference to FIG. 4, the camera is calibrated so that the images captured by the camera can be used to accurately make dimensional measurements. For purposes of measuring geometric dimensions of the deposited material, the camera may be either a hyperspectral camera 108 or a visible spectrum camera 110. At block 500, desired images from the captured images are selected. For example, in the case of images captured by the hyperspectral camera 108, each captured image frame includes a plurality of images as different spectral bands. Thus, images from the desired spectrums may be selected. An edge detection and/or line segment detection may be performed on the selected images to measure a height and width of the deposited material at block 502.

Figure 10A:
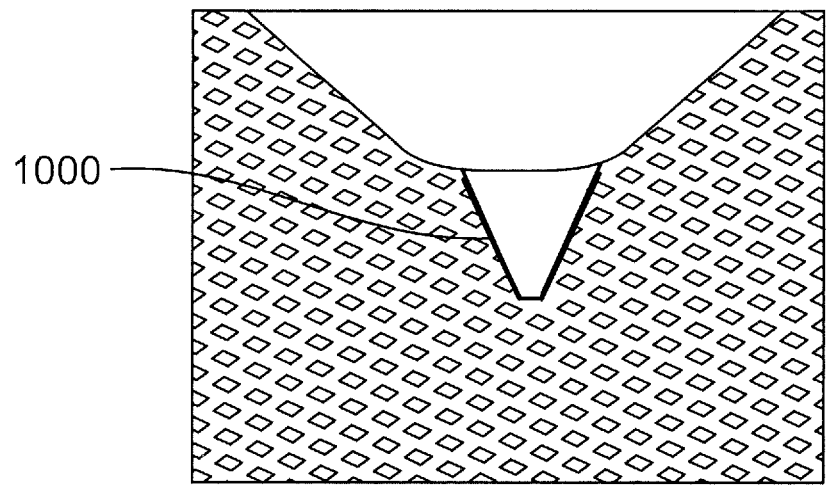
FIGS. 10A and 10B illustrate a computing device measuring the deposited material, according to embodiments of the present disclosure.
Figure 10B:
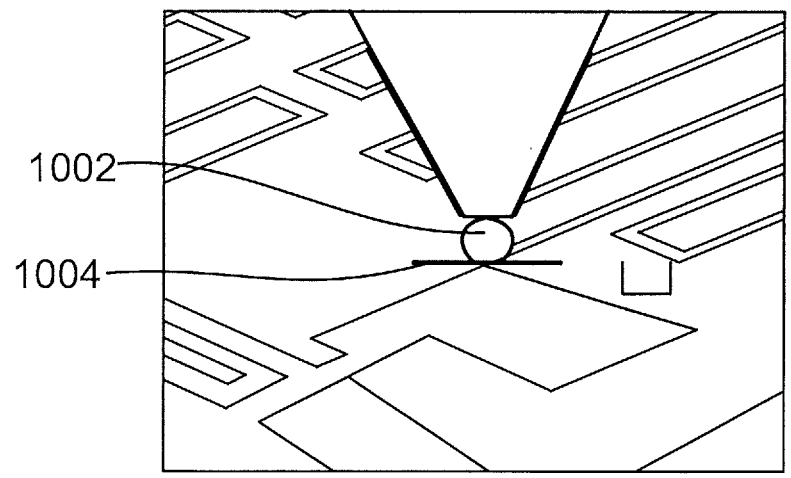

FIGS. 10A-10B illustrate exemplary performance of edge detection and line segment detection using libraries such as OpenCV among others known to those skilled in the art. For example, in FIG. 10A, line segments 1000 of angled portions of the deposition tip is detected and in FIG. 10B, edge detection 1004 is performed on the deposited material 1002. Based on the line segment and edge detection, the half angle of the tip, the length of the tip taper, and the outer diameter at the extrusion point of the tip may be determined. Because the actual geometric dimensions of the tip is already known (e.g., via manufacture's specification or through previous physical measurements), and the height of the deposition tip above the deposition surface (i.e., distance between the tip and the deposition surface) is also known, the known dimensions can be extrapolated by the computing device 102 to determine the geometric dimensions of the deposited material. Turning back to FIG. 5, at block 504, the measured dimensions are then compared with desired dimensions, which are stored in the dimensional database 331. That is, the desired dimensions are predetermined and stored in the dimensional database 331. Therefore, if the deposited material is smaller or larger than the dimensions of the desired dimensions, then one or more parameter values may be adjusted to correct the dimension of the deposited material. For example, if the measured dimensions of the deposited material are smaller than the desired dimensions, then the flow rate of the deposition material may be increased in order to allow more deposition material to be dispensed on to the substrate. Alternatively or additionally, the temperature of the dispense head or the deposition tip which melts the deposition material may be increased to allow more deposition material to be deposited on the substrate. Thus, the dimensions of the deposited material based on this adjustment may be increased to be closer to the desired dimensions. Accordingly, the computing device 102 is configured to generate the corrective parameters at block 506 in which the additive manufacturing device control 331 can send to the additive manufacturing device 104 through control signals.

Figure 6:
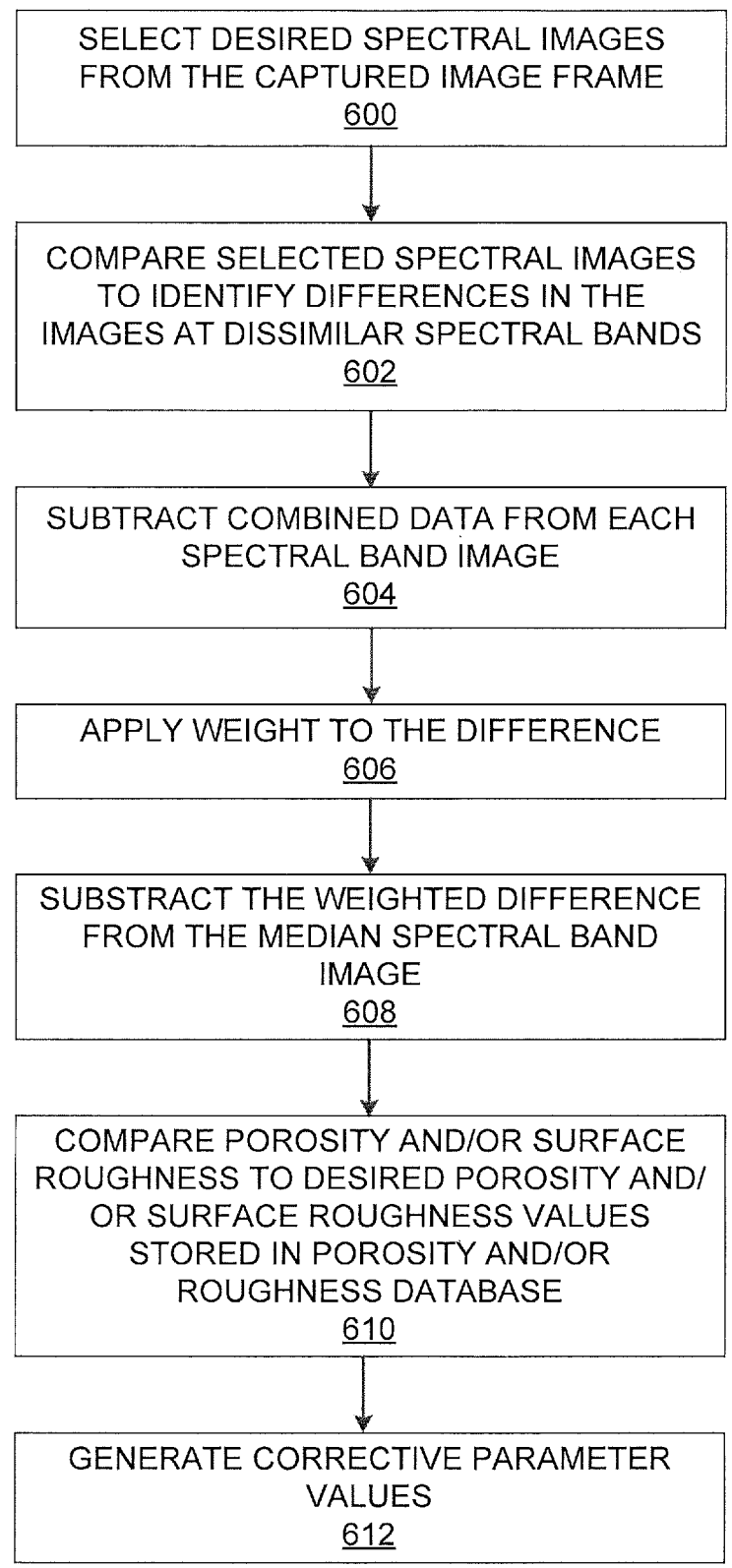
FIG. 6 is a flow chart illustrating a process for using spectral images to determine and adjust porosity and surface roughness of the deposited material, according to an embodiment of the present disclosure.

FIG. 6 is a flow chart illustrating an exemplary process for processing the captured image frame discussed in block 414 of FIG. 4 for using spectral images to determine and adjust porosity and surface roughness of the deposited material. As discussed earlier, the hyperspectral camera 108 captures images at a plurality of (e.g., hundreds of) different spectral ranges. Thus, a single captured image frame from the hyperspectral camera includes hundreds of images of the same scene captured at the same moment in time at different wavelength spectrums. According to an embodiment, desired spectral images from the captured image frame are selected at block 600. Once the desired spectral images are selected, the spectral images are compared to identify differences in the image at different spectrums at block 602. That is, arithmetic operations are performed to determine porosity and root-mean-square (RMS) surface roughness by combining images from different spectral bands to identify defects and voids in material. Accordingly, images from two or more different spectral bands of the deposited material as captured by the hyperspectral camera 108 may be overlaid to identify defects and voids in the deposited material.

More specifically, as provided in blocks 604, 606, and 608, the images are overlaid and the combined data is subtracted from each spectral band image. Next, a weight is applied to each spectral band image and the weighted difference is subtracted from the median spectral band image. Next, a porosity profile and/or a surface roughness profile are generated. Whereas a defect or a void in the deposited material may not be visible by merely inspecting an image from a single spectrum, the overlaying techniques described in the present disclosure provide methods for identifying defects or voids by looking at the porosity and/or surface roughness profiles. At block 610, the determined porosity and/or surface roughness is compared to desired porosity and/or surface roughness values stored in the porosity database 332 and/or the surface roughness database 333. Therefore, the computing device 102 can determine appropriate corrective measures based on the comparison and generate corrective parameter values at block 612 in order to improve the characteristics or quality of further (or additional) deposited material.

In some embodiments, the corrective parameter values for adjusting the surface roughness of the additional deposited material may correspond to a flow rate of the deposition material through the deposition tip and/or temperature of the substrate.

In some embodiments, the corrective parameter values for adjusting the porosity of the deposited material may correspond to a flow rate of the additional material through the deposition tip, an air pressure applied to the dispense head, solvent content, chemical release rate, plasmonic resonance, optical refractive index, measurable height, mechanical stress, and/or surface tension of the deposited material. For example, adjusting the flow rate may affect the rate at which the deposited material forms on the substrate, which in turn affects the density or porosity of the material as it dries.

Figure 7:
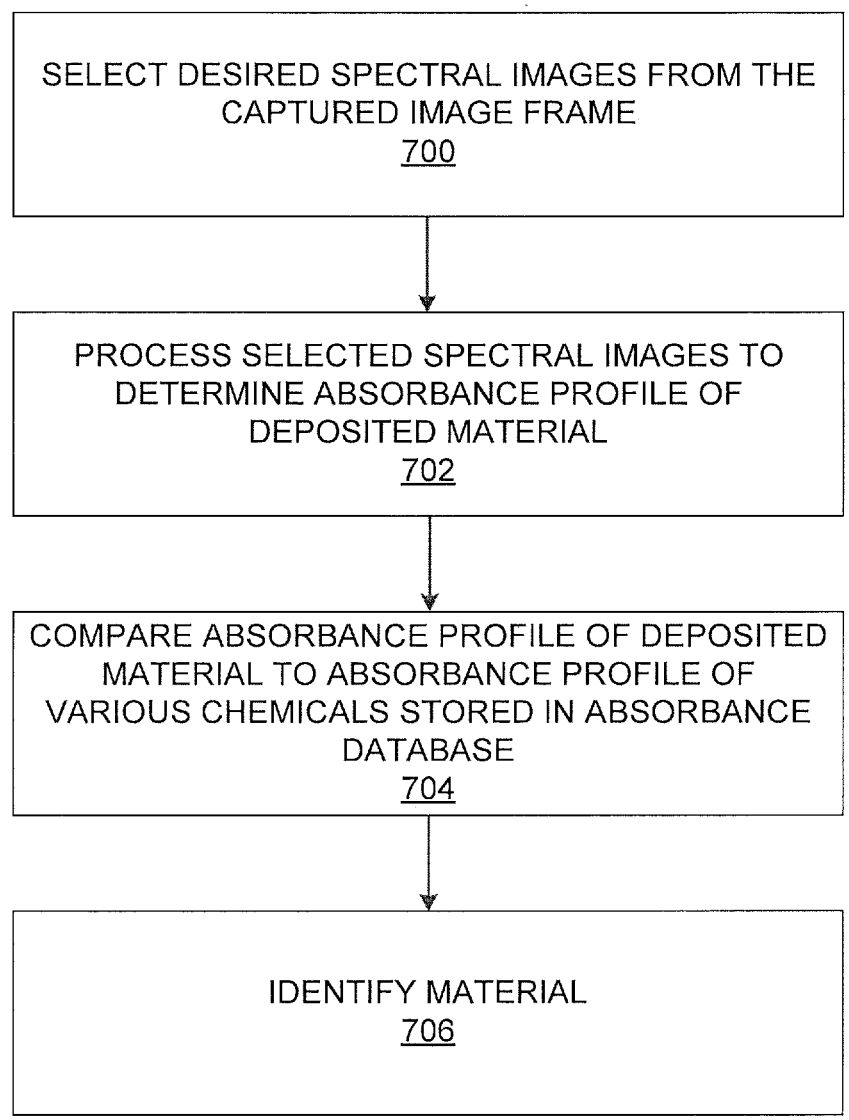
FIG. 7 is a flow chart illustrating a process for using spectral images to determine absorbance profile of the deposited material and identifying a chemical compound of the deposited material, according to an embodiment of the present disclosure.

FIG. 7 is a flow chart illustrating an exemplary process for processing the captured image frame discussed in block 414 of FIG. 4 for using spectral images to identify a chemical composition of the deposited material by determining an absorbance profile of the deposited material. Absorbance profiles can be generated from spectral images by plotting absorbance data in a graph to determine useful information pertaining to the imaged deposition material. For example, by plotting the absorbance data across a spectrum, a plasmonic resonance of the chemical composition may be determined. Accordingly, a plurality of desired spectral images may be selected from the captured images at block 700. An absorbance profile of the deposited material may be generated by processing information from the selected spectral images at block 702. At block 704, the generated absorbance profile of the deposited material may be compared with the absorbance profiles of various chemical compounds stored in the absorbance profile database 334. That is, predetermined absorbance profiles of various known chemical compounds are stored in the absorbance profile database 334. Therefore, by comparing and matching the absorbance profile of the deposited material, the chemical compound of the deposited material may be identified at block 706. More specifically, the plasmonic resonance wavelength may be matched to plasmonic resonance wavelength stored in the absorbance profile database 334 to identify the chemical compound that the absorbance profiles corresponds with.

Figure 8:
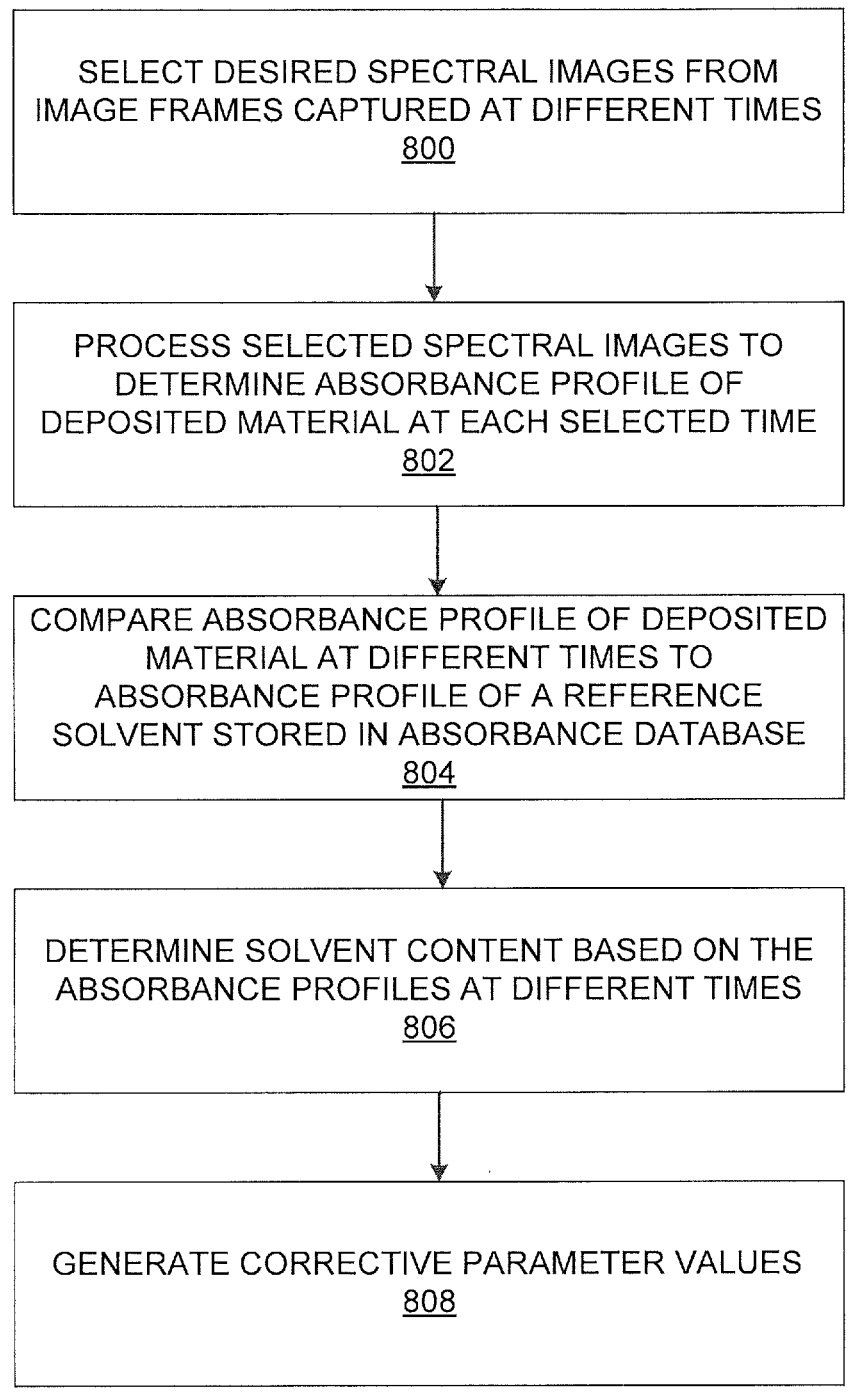
FIG. 8 is a flow chart illustrating a process for using spectral images to determine the absorbance profile of the deposited material and adjusting the drying time of the deposited material, according to an embodiment of the present disclosure.

FIG. 8 is a flow chart illustrating an exemplary process for processing the captured image frame discussed in block 414 of FIG. 4 for using spectral images to determine the absorbance profile of the deposited material and adjusting the drying time of the deposited material.

According to an embodiment, the drying time of the deposited material (e.g., liquid ink) may be controlled by regulating the solvent concentration in the deposited material. Furthermore, the solvent concentration may be controlled by adjusting the temperature and the flow rate of the deposition material. Therefore, by observing the solvent content in the deposited material through hyperspectral imaging, parameter adjustments can be made to affect the drying time of the deposited material. Thus, at block 800, desired spectral images are selected from the captured image frame at different times. Next at block 802, the selected images are processed to generate absorbance profile for the deposited material. By comparing the absorbance profile of the deposited material at different times to predetermined absorbance profiles (e.g., for a reference solvent) stored in the absorbance profile database 334 at block 804, solvent content in the deposition material may be determined at block 806. Once the solvent content is determined, further processing can be performed to determine if the desired drying time is being achieved. If not, then the parameters can be adjusted to change the solvent content, if needed, which in turn changes the drying time at block 808. For example, the temperature of the deposition surface may be increased to rapidly dry the deposited material. In other embodiments, the temperature of the deposition material through the deposition tip or the flow rate of the deposition material through the deposition tip may be adjusted to change the solvent concentration.

Figure 9:
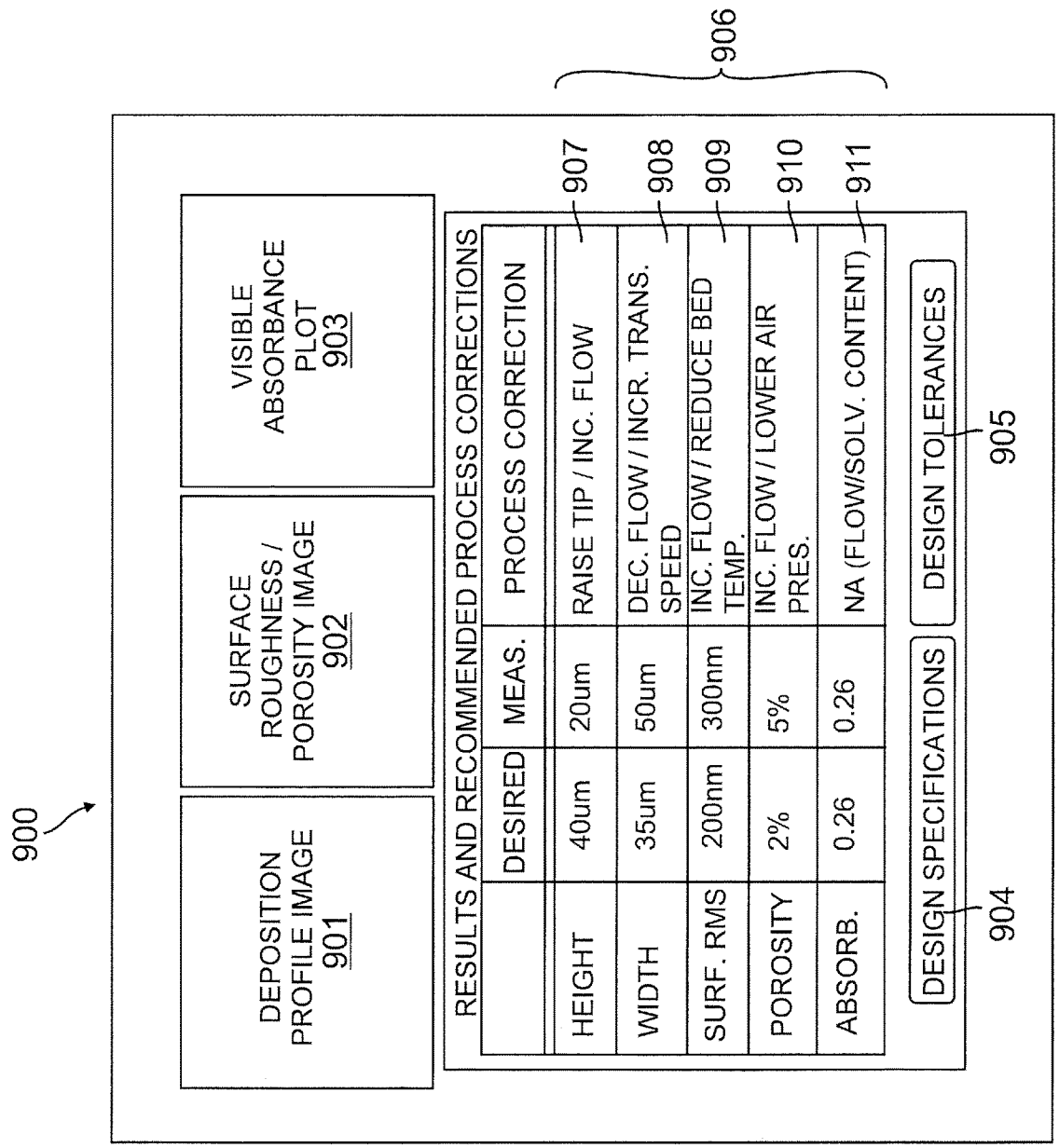
FIG. 9 illustrates an exemplary user interface for operating an additive manufacturing system, according to an embodiment of the present disclosure.

FIG. 9 illustrates an exemplary user interface 900 for operating an additive manufacturing system 100. According to an embodiment, the user interface 900 may be a touch screen display that is a part of or configured to function together with the computing device 102. The user interface 900 is an interface where the operator can see a status of the additive manufacturing process. For example, the user interface 900 includes images of a deposition profile 901, surface roughness/porosity 902, and visible absorbance (plot) 903 so that the operator can visually see the images that are captured by the camera and any data that is processed by the computing device 102 based on the captured images. The user interface 900 also includes a list of parameters 906, which shows both a desired parameter value and an actual measured parameter value for each corresponding parameter. For example, one of the parameters is the height of the deposited material, which is indicated on the user interface 900 as having a desired height of 40 micrometers. In this example, the actual height was measured to be 20 micrometers. Thus, the computing device 102 generated a recommended corrective action, which is displayed on the user interface 900 as raising the deposition tip and/or increasing the flow rate of the deposition material in order to bring the height of the deposited material to be closer to the desired height 907. As previously discussed, the operator may then accept the recommended corrective action, decline the recommended corrective action, modify the recommended corrective action, or the system can be configured to automatically make the recommended corrective actions.

According to another example parameter, the width of the deposited material is measured to be greater than the desired width. The computing device 102 generated a recommended corrective action to decrease the flow rate of the deposited material and/or increasing the translational speed 908.

According to another example parameter, the RMS surface roughness was measured to be greater than the desired RMS surface roughness. The computing device 102 generated a recommended corrective action to increase the flow rate of the deposited material and/or reduce the temperature of the deposition surface 909.

According to another example parameter, the porosity of the deposited material is determined to be greater than the desired porosity value. The computing device 102 generated a recommended corrective action of increasing the flow rate of the deposition material and/or lowering the air pressure 910.

According to yet another example parameter, the absorbance data of the deposited material is measured to be the expected value. Thus, the computing device 102 did not make any recommended corrective actions 911.

In some embodiments, the operator may manually enter initial parameter values for each of the parameters (e.g., design specifications) or revise existing parameter values by accessing a menu through button 904. The operator may also set design tolerances for each desired parameter value by accessing a menu through button 905. Yet in some embodiments, the parameter values may be configured to change colors, for example, to red when the measured parameter value is significantly off in order to alert the operator. In other embodiments, the parameter values may be green to let the operator know that the measured parameter values are within tolerance, while in some embodiments, the parameter values may be yellow to inform the operator that the measure parameter value is slightly off.

The user interface illustrated in FIG. 9 is provided to merely illustrate an example user interface that may be used by the additive manufacturing system 100. However, the example user interface is not intended to be limiting. Instead, many other types and forms of user interfaces may be contemplated. Some user interfaces may have physical buttons, switches, and dials, whereas other user interfaces may be fully touch screen or voice activated. A person having ordinary skill in the art would appreciate any suitable user interface.

In view of the present disclosure, the techniques provide for a spectroscopic and spatial measurement of the deposition material as it dries. Thus, one can evaluate the effects of the drying agents, chemical additives, and adhesive properties present in the wet process as the deposition material dries onto the surface. Moreover, the various embodiments provide for simultaneous measurement of surface roughness, void content, fill factor and physical geometry of the deposited material. Thus, both the physical and chemical properties of the deposited material (e.g., conductive trace, 3D printed feature, painted surface, magnetic media, etc.) may be evaluated in real time. Therefore, manufacturing process controls are improved and may ultimately reduce manufacturing labor and rework that is associated with wet processes from liquid coatings, paints, ink processes, and thermoplastic forming.

Herein the present disclosure, example embodiments are described with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof are not repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Herein the present disclosure, it is understood that when an element or layer is referred to as being "on," "connected to," or "coupled to" another element or layer, it can be directly on, connected to, or coupled to the other element or layer, or one or more intervening elements or layers may be present. In addition, it is also understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It is further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein.

The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims and their equivalents.

The invention claimed is:

1. A method comprising:
operating a direct writing device configured to deposit material on a substrate through a tip to provide a portion of a product according to initial parameter values;
receiving a hyperspectral image frame comprising a plurality of spectral images of the deposited material and the tip;
processing the received hyperspectral image frame to determine a characteristic of the deposited material, wherein the characteristic comprises at least one of width or height of the deposited material, and wherein the at least one of the width or height is determined by comparing the deposited material shown within the image to the tip;
comparing the determined characteristic with a target characteristic, wherein the comparing comprises comparing the measured at least one of width and height with a predetermined target value stored in a dimensional database;
determining at least one corrective parameter value to conform the determined characteristic to the target characteristic;
updating at least one of the initial parameter values with the corrective parameter values; and
operating the direct writing device to deposit additional material on the substrate according to the corrective parameter value.

2. The method of claim 1, wherein the direct writing device is an additive manufacturing device.

3. The method of claim 1, wherein:
the processing comprises performing edge detection and line segment detection on the one or more of the spectral images to measure the at least one of width or height of the deposited material, wherein the determining the characteristic of the deposited material further comprises:
  detecting line segments corresponding to the tip within the hyperspectral image frame; and
  determining the width or height of the deposited material based on a comparison with the detected line segments corresponding to the tip.

4. The method of claim 3, wherein the corrective parameter value corresponds to at least one of a height of the tip, a flow rate of source material through the tip, and a translation speed of the tip, to adjust at least one of a width or a height of the additional deposited material.

5. The method of claim 1, wherein:
  the processing comprises performing an arithmetic operation with two or more of the spectral images to generate at least one of a porosity profile and surface roughness profile of the deposited material; and
  the comparing comprises comparing the generated porosity profile and surface roughness profile with at least one of a porosity profile and surface roughness profile stored in at least one of a porosity database and surface roughness database.

6. The method of claim 5, wherein the arithmetic operation comprises overlaying a plurality of spectral images associated with different spectral bands and subtracting differences between the two or more spectral images captured at the different spectral bands.

7. The method of claim 5, wherein the corrective parameter value corresponds to at least one of a flow rate of the additional material through the tip and a temperature of the substrate, to adjust a surface roughness of the additional deposited material.

8. The method of claim 5, wherein the corrective parameter value corresponds to one or more selected from the group consisting of: a flow rate of the additional material through the tip, an air pressure, solvent content, chemical release rate, plasmonic resonance, optical refractive index, measurable height, mechanical stress, and surface tension, to adjust a porosity of the additional deposited material.

9. The method of claim 1, further comprising:
  generating an absorbance profile of the deposited material based on one or more of the spectral images;
  comparing the generated absorbance profile with an absorbance profile stored in an absorbance profile database; and
  performing a chemical analysis of the deposited material based on the absorbance profile to identify a chemical composition of the deposited material.

10. The method of claim 1, further comprising receiving at least an additional hyperspectral image frame captured at a different time from the hyperspectral image frame, the additional hyperspectral image comprising a plurality of additional spectral images of the deposited material at the different time, wherein:
  the processing comprises generating a plurality of absorbance profiles of the deposited material at different times based on the spectral images and the additional spectral images;
  the comparing comprises comparing each of the absorbance profiles with reference absorbance profiles stored in an absorbance database to determine solvent content in the deposited material; and
  the corrective parameter value corresponds to at least one of a temperature of a substrate and flow rate of the additional material through the tip, to adjust a drying time of the deposited material.

11. A system comprising:
a memory comprising instructions; and
a processor configured to execute the instructions to perform operations comprising:
  operating a direct writing device configured to deposit material on a substrate through a tip to provide a portion of a product according to initial parameter values,
  receiving a hyperspectral image frame comprising a plurality of spectral images of the deposited material and the tip,
  processing the received hyperspectral image frame to determine a characteristic of the deposited material, wherein the characteristic comprises at least one of width or height of the deposited material, and wherein the at least one of the width or height is determined by comparing the deposited material shown within the image to the tip,
  comparing the determined characteristic with a target characteristic, wherein the comparing comprises comparing the measured at least one of width and height with a predetermined target value stored in a dimensional database,
  determining at least one corrective parameter value to conform the determined characteristic to the target characteristic,
  updating at least one of the initial parameter value with the corrective parameter values, and
  operating the direct writing device to deposit additional material on the substrate according to the corrective parameter value.

12. The system of claim 11, wherein the direct writing device is an additive manufacturing device.

13. The system of claim 11, wherein:
  the processing comprises performing edge detection and line segment detection on the one or more of the spectral images to measure the at least one of width or height of the deposited material, wherein the determining the characteristic of the deposited material further comprises:
  detecting line segments corresponding to the tip within the hyperspectral image frame; and
  determining the width or height of the deposited material based on a comparison with the detected line segments corresponding to the tip.

14. The system of claim 13, wherein the corrective parameter value corresponds to at least one of a height of the tip, a flow rate of source material through the tip, and a translation speed of the tip, to adjust at least one of a width or a height of the additional deposited material.

15. The system of claim 11, wherein:
  the processing comprises performing an arithmetic operation with two or more of the spectral images to generate at least one of a porosity profile and surface roughness profile of the deposited material; and
  the comparing comprises comparing the generated porosity profile and surface roughness profile with at least one of a porosity profile and surface roughness profile stored in at least one of a porosity database and surface roughness database.

16. The system of claim 15, wherein the arithmetic operation comprises overlaying a plurality of spectral images associated with different spectral bands and subtracting differences between the two or more spectral images captured at the different spectral bands.

17. The system of claim 15, wherein the corrective parameter value corresponds to at least one of a flow rate of the additional material through the tip and a temperature of the substrate, to adjust a surface roughness of the additional deposited material.

18. The system of claim 15, wherein the corrective parameter value corresponds to one or more selected from the group consisting of: a flow rate of the additional material through the tip, an air pressure, solvent content, chemical release rate, plasmonic resonance, optical refractive index, measurable height, mechanical stress, and surface tension, to adjust a porosity of the additional deposited material.

19. The system of claim 11, wherein the processor is configured to execute the instructions to further perform operations comprising:
generating an absorbance profile of the deposited material based on one or more of the spectral images;
comparing the generated absorbance profile with an absorbance profile stored in an absorbance profile database; and
performing a chemical analysis of the deposited material based on the absorbance profile to identify a chemical composition of the deposited material.

20. The system of claim 11, wherein the processor is configured to execute the instructions to further perform operations comprising receiving at least an additional hyperspectral image frame captured at a different time from the hyperspectral image frame, the additional hyperspectral image comprising a plurality of additional spectral images of the deposited material at the different time, wherein:
the processing comprises generating a plurality of absorbance profiles of the deposited material at different times based on a spectral image of spectral images and an additional spectral image of the additional spectral images;
the comparing comprises comparing each of the absorbance profiles with reference absorbance profiles stored in an absorbance database to determine solvent content in the deposited material; and
the corrective parameter value corresponds to at least one of a temperature of a substrate and a flow rate of the additional material through the tip, to adjust a drying time of the deposited material and the solvent.

* * * * *